US012656839B2

(12) United States Patent
Wang et al.

(10) Patent No.: US 12,656,839 B2
(45) Date of Patent: Jun. 16, 2026

(54) DISPLAY PANEL INCLUDING CIRCUIT LAYER AND CONDUCTIVE LAYER ELECTRICALLY CONNECTED TO EACH OTHER THROUGH VIA AND METHOD FOR MANUFACTURING THE SAME, AND DISPLAY APPARATUS

(71) Applicants:MIANYANG BOE OPTOELECTRONICS TECHNOLOGY CO.,LTD., Mianyang (CN); BOE TECHNOLOGY GROUP CO., LTD., Beijing (CN)

(72) Inventors: Xuan Wang, Beijing (CN); Chuanwu Mou, Beijing (CN); Pohsuan Chiang, Beijing (CN)

(73) Assignees: MIANYANG BOE OPTOELECTRONICS TECHNOLOGY CO., LTD., Mianyang (CN); BOE TECHNOLOGY GROUP CO., LTD., Beijing (CN)

( * ) Notice: Subject to any disclaimer, the term of this patent is extended or adjusted under 35 U.S.C. 154(b) by 1094 days.

(21) Appl. No.: 16/977,021

(22) PCT Filed: Feb. 21, 2020

(86) PCT No.: PCT/CN2020/076256
§ 371 (c)(1),
(2) Date: Aug. 31, 2020

(87) PCT Pub. No.: WO2020/169087
PCT Pub. Date: Aug. 27, 2020

(65) Prior Publication Data
US 2021/0011531 A1      Jan. 14, 2021

(30) Foreign Application Priority Data

Feb. 22, 2019     (CN) .......................... 201910136907.3

(51) Int. Cl.
*G02F 1/1345* (2006.01)
*G06F 1/18* (2006.01)
(Continued)

(52) U.S. Cl.
CPC .......... *G06F 1/189* (2013.01); *G02F 1/13452* (2013.01); *G09F 9/301* (2013.01); *H05K 1/115* (2013.01); *H05K 3/146* (2013.01)

(58) Field of Classification Search
CPC . H01L 27/124; H01L 23/481; H01L 27/1248; H01L 21/486; H01L 21/76805;
(Continued)

(56) References Cited

U.S. PATENT DOCUMENTS

2011/0140114 A1*  6/2011  Ko ....................... H10K 50/818
                                                           438/23
2013/0241020 A1     9/2013  Wataya
(Continued)

FOREIGN PATENT DOCUMENTS

CN        103413820 A     11/2013
CN        107039377 A     8/2017
(Continued)

OTHER PUBLICATIONS

First Office Action for related CN App No. 201910136907.3 dated Apr. 2, 2020, 16 pgs.
(Continued)

*Primary Examiner* — David Chen
(74) *Attorney, Agent, or Firm* — Procopio, Cory, Hargreaves & Savitch LLP

(57) ABSTRACT
A display panel includes a flexible base, and a circuit layer, an insulating layer, and a conductive layer that are sequentially stacked on the flexible base. The circuit layer is configured to be bonded to an external circuit structure. The conductive layer is configured such that electrical signals
(Continued)

transmitted between the conductive layer and the circuit layer. At least one via is provided in the insulating layer, and the conductive layer is electrically connected to the circuit layer through the at least one via. At least one opening corresponding to at least partial region of the circuit layer is provided in the flexible base, and the at least one opening is configured to receive at least part of the circuit structure.

10 Claims, 14 Drawing Sheets

(51) Int. Cl.
| | | |
|---|---|---|
| *G09F 9/30* | (2006.01) | |
| *H05K 1/11* | (2006.01) | |
| *H05K 3/14* | (2006.01) | |

(58) Field of Classification Search
CPC ............... H01L 23/5226; H01L 23/482; H01L 2224/0233; G02F 1/13452; H05K 1/115; H05K 3/146; G06F 1/189; G06F 1/1652; G06F 1/1637; G09F 9/301; H10K 77/111; H10K 59/131
USPC ............................... 257/72, 433; 438/23, 614
See application file for complete search history.

(56) References Cited

U.S. PATENT DOCUMENTS

| | | | |
|---|---|---|---|
| 2014/0375916 A1 | | 12/2014 | Chen et al. |
| 2016/0013442 A1* | | 1/2016 | Akimoto ............. H10K 59/873 |
| | | | 257/40 |
| 2017/0263891 A1 | | 9/2017 | Oh et al. |
| 2017/0371376 A1* | | 12/2017 | Chung ............. G02F 1/133305 |
| 2018/0006058 A1* | | 1/2018 | Lee .................... H10D 30/6729 |
| 2018/0174505 A1* | | 6/2018 | Mandlik ............. G09G 3/3677 |
| 2018/0247994 A1* | | 8/2018 | Seo ..................... H01L 27/1214 |
| 2019/0064256 A1* | | 2/2019 | Wang ................. G01R 31/2843 |
| 2019/0131369 A1* | | 5/2019 | Choi ................... H10K 59/131 |
| 2019/0131377 A1* | | 5/2019 | Kwon ................. H10K 50/844 |
| 2019/0371707 A1* | | 12/2019 | Yueh .................. H01L 23/4985 |
| 2020/0098841 A1 | | 3/2020 | Song et al. |
| 2020/0105790 A1 | | 4/2020 | Gu et al. |
| 2020/0142241 A1 | | 5/2020 | Jing |
| 2020/0219961 A1* | | 7/2020 | Managaki .......... H01L 23/4985 |
| 2020/0312886 A1* | | 10/2020 | Yuan .................... H01L 25/167 |

FOREIGN PATENT DOCUMENTS

| | | |
|---|---|---|
| CN | 107180850 A | 9/2017 |
| CN | 107256870 A | 10/2017 |
| CN | 108089382 A | 5/2018 |
| CN | 109244086 A | 1/2019 |
| CN | 109273498 A | 1/2019 |

OTHER PUBLICATIONS

Notification of the Second Office Action for related CN App No. 201910136907.3 dated Jan. 6, 2021, 17 pgs.

* cited by examiner

100

100

A-A'

A-A'

A-A'

A-A'

A-A'

A-A'

A-A'

A-A'

~10

~27
~12

B-B'

~17
~16
~14
~136
~135
~134
~133
~132
~11

Form a flexible base on a substrate          S101

Form a circuit layer on the flexible base          S102

Form an insulating layer covering the circuit layer, the insulating layer having via(s) exposing the circuit layer          S103

Form a conductive layer on the insulating layer, the conductive layer being electrically connected to the circuit layer through the via(s)          S104

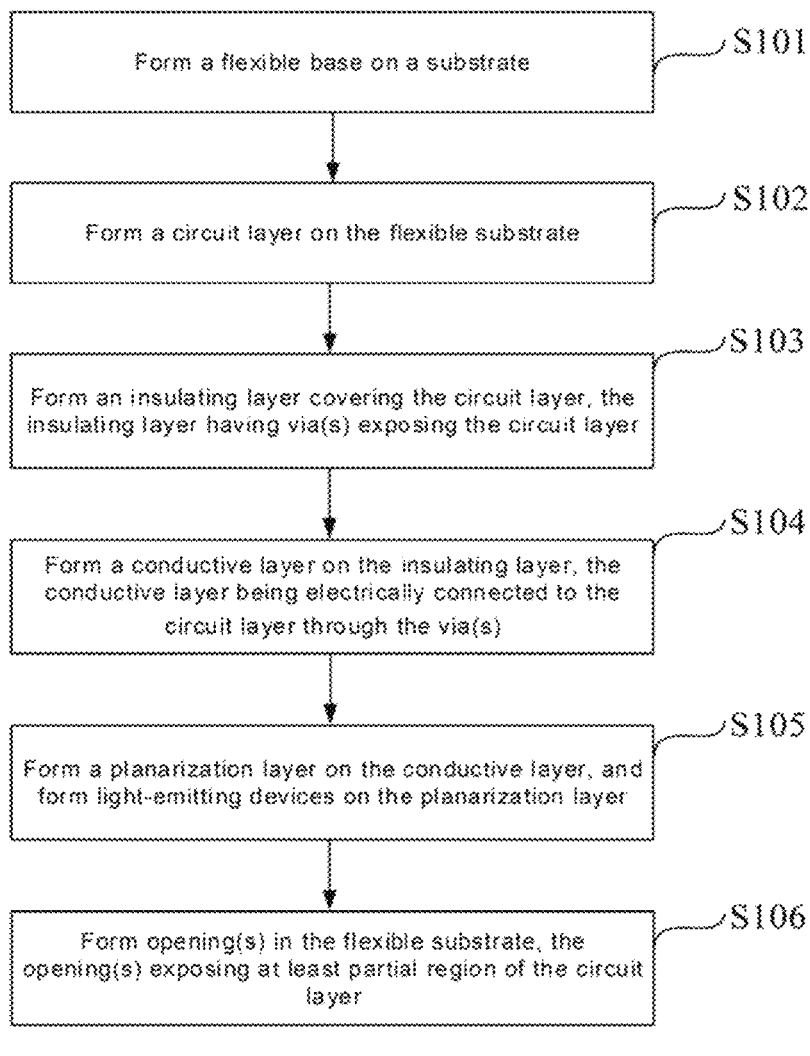

S101 Form a flexible base on a substrate

S102 Form a circuit layer on the flexible substrate

S103 Form an insulating layer covering the circuit layer, the insulating layer having via(s) exposing the circuit layer S104 Form a conductive layer on the insulating layer, the conductive layer being electrically connected to the circuit layer through the via(s)

S105 Form a planarization layer on the conductive layer, and form light-emitting devices on the planarization layer S106 Form opening(s) in the flexible substrate, the opening(s) exposing at least partial region of the circuit layer

FIG. 7

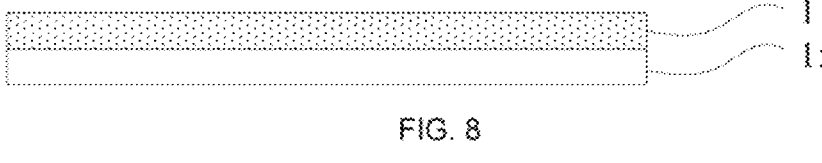

FIG. 8

FIG. 9A

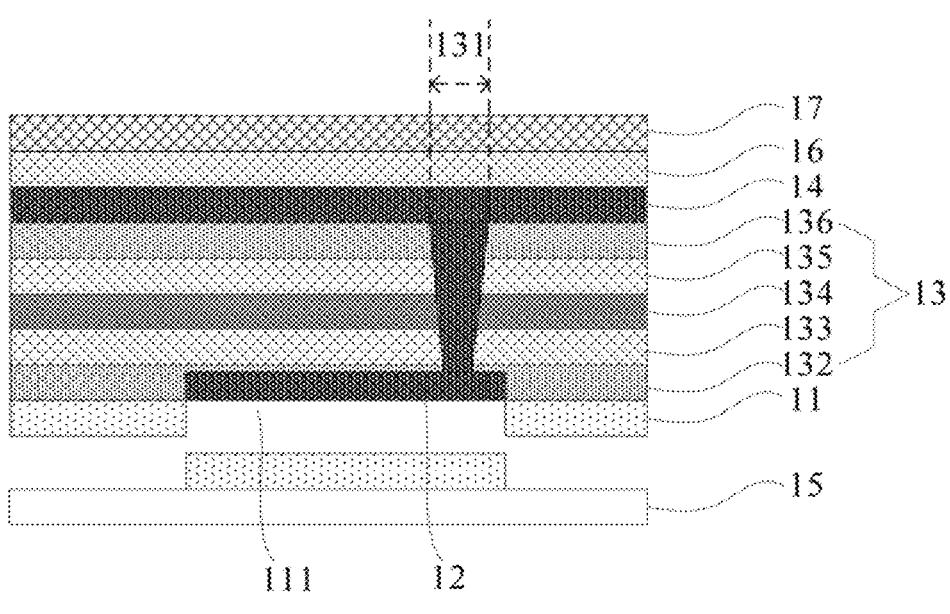
FIG. 16
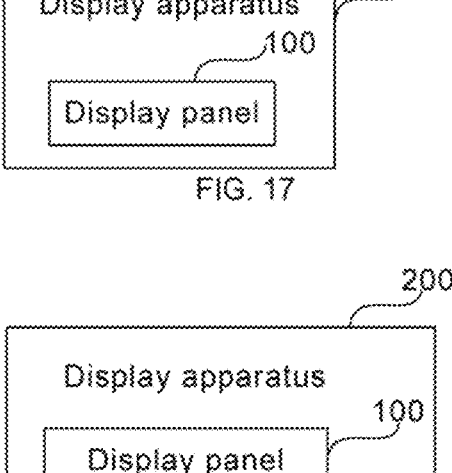
FIG. 17
FIG. 18

DISPLAY PANEL INCLUDING CIRCUIT LAYER AND CONDUCTIVE LAYER ELECTRICALLY CONNECTED TO EACH OTHER THROUGH VIA AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2020/076256 filed on Feb. 21, 2020, which claims priority to and the benefit of Chinese Patent Application No. 201910136907.3, filed on Feb. 22, 2019, titled "A DISPLAY PANEL AND METHOD FOR MANUFACTURING THE SAME, DISPLAY APPARATUS", which are incorporated herein by reference in their entirety.

TECHNICAL FIELD

The present disclosure relates to the field of display technologies, and in particular, to a display panel and a method for manufacturing the same, and a display apparatus.

BACKGROUND

A display panel usually has a frame. In order to reduce a width of the frame, so as to improve a utilization rate of the display panel, in an existing design, a circuit layer in the display panel including a chip and other structures is bent to a back surface of a base substrate of the display panel.

SUMMARY

In one aspect, a display panel is provided. The display panel includes: a flexible base, and a circuit layer, an insulating layer, and a conductive layer that are sequentially stacked on the flexible base. The circuit layer is configured to be bonded to an external circuit structure. The conductive layer is configured such that electrical signals are transmitted between the conductive layer and the circuit layer. At least one via is disposed in the insulating layer, and the conductive layer is electrically connected to the circuit layer through the at least one via. At least one opening corresponding to at least partial region of the circuit layer is provided in the flexible base, and the at least one opening is configured to receive at least part of the circuit structure.

In some embodiments, the display panel further includes a conductive material provided in the at least one via. The conductive material is in contact with both the conductive layer and the circuit layer.

In some embodiments, the conductive layer includes a portion extending into the, at least one via and contacting a partial surface of the circuit layer proximate to the insulating layer.

In some embodiments, orthographic projections of the circuit layer, the insulating layer, and the conductive layer on the flexible base have an overlapping region.

In some embodiments, the circuit layer includes a chip. The conductive layer includes at least one of traces, leads of the traces, electrodes, and a gate driver circuit.

In some embodiments, the conductive layer includes three sub-layers that are stacked a material of an intermediate sub-layer among the three sub-layers includes aluminum, and a material of other two sub-layers is titanium.

In some embodiments, a material of the conductive layer includes at least one of titanium, aluminum, magnesium, silver, and tungsten.

In some embodiments, the conductive material includes any one of copper, aluminum, steel, tungsten, tin, or lead.

In some embodiments, the display panel further includes a planarization layer disposed on the conductive layer and a plurality of light-emitting devices disposed on the planarization layer.

In another aspect, a method for manufacturing a display panel is provided. The method includes: forming a flexible base on a substrate; forming a circuit layer on the flexible base, wherein the circuit layer is configured to be bonded to an external circuit structure; forming an insulating layer covering the circuit layer, wherein the insulating layer includes a barrier layer, a buffer layer, a first gate insulating layer, a second gate insulating layer, and an interlayer dielectric layer that are sequentially stacked on the circuit layer, and the insulating layer has at least one via exposing the circuit layer; forming a conductive layer on the insulating layer, wherein the conductive layer is electrically connected to the circuit layer through the at least one via, and the conductive layer is configured such that electrical signals are transmitted between the conductive layer and the circuit layer. After forming the circuit layer on the flexible base, the method further includes: forming at least one opening in the flexible base, the at least one opening exposing at least partial region of the circuit layer.

In some embodiments, before forming the conductive layer on the insulating layer, the method further includes: filling a conductive material in the at least one via. The conductive material is in contact with the circuit layer, and the conductive layer is in contact with the conductive material during a process of forming the conductive layer on the insulating layer.

In some embodiments, during the process of forming the conductive layer on the insulating layer, a portion of the conductive layer extends into the at least one via, so as to contact a partial surface of the circuit layer proximate to the insulating layer.

In some embodiments, forming the at least one opening in the flexible base, the at least one opening exposing the at least partial region of the circuit layer, includes: separating a one-piece structure as which the substrate and a portion of the flexible base corresponding to the at least partial region of the circuit layer are taken from a portion of the flexible base other than the portion corresponding to the at least partial region, so as to form the at least one opening exposing the at least partial region of the circuit layer.

In some embodiments, separating the one-piece structure as which the substrate and a portion of the flexible base corresponding to the at least partial region of the circuit layer are taken from the portion of the flexible base other than the portion corresponding to at least partial region, so as to form the at least one opening exposing the at least partial region of the circuit layer, includes:

performing laser scanning on other regions of the substrate other than a region corresponding to the at least partial region of the circuit layer; separating the one-piece structure as which the substrate and a portion of the flexible base corresponding to the at least partial region of the circuit layer are taken from the portion of the flexible base other than the portion corresponding to the at least partial region.

In yet another aspect, a display apparatus is provided. The display apparatus includes the display panel provided in any one of the foregoing embodiments.

In some embodiments, the display apparatus further includes a circuit structure located outside the display panel. At least one opening corresponding to at least partial region of the circuit layer is disposed in the flexible base of the display panel. At least part of the circuit structure is disposed in the at least one opening.

In some embodiments, the circuit structure include a circuit board.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual dimensions of products, actual processes of methods and actual timings of signals to which the embodiments of the present disclosure relate.

FIG. 2C shows a schematic cross-sectional diagram of yet another structure of the display panel taken along the A-A' direction in FIG. 1A or 1B according to embodiments of the present disclosure;

FIG. 7 shows a flowchart of another method for manufacturing a display panel, according to embodiments of the present disclosure;

FIG. 8 shows a schematic diagram of a structure formed in step 101 of a method for manufacturing a display panel, according to embodiments of the present disclosure;

FIG. 9A shows a schematic diagram of a structure formed in step 102 of a method for manufacturing a display panel, according to embodiments of the present disclosure;

FIG. 16 shows a schematic diagram of a structure formed in step 106 of a method for manufacturing a display panel, according to embodiments of the present disclosure;

FIG. 17 shows a block diagram of a functional structure of a display apparatus, according to embodiments of the present disclosure;

FIG. 18 shows a block diagram of a functional structure of another display apparatus, according to embodiments of the present disclosure;

DETAILED DESCRIPTION

Figure 1A:
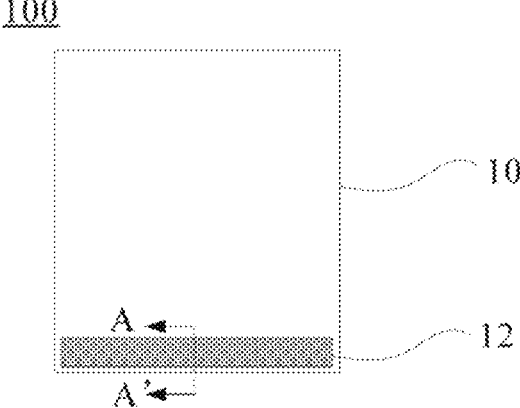
FIG. 1A shows a schematic top view of a structure of a display panel, according to embodiments of the present disclosure.

Technical solutions in some embodiments of the present disclosure will be described clearly and completely with reference to the accompanying drawings, Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the entire description and the claims, the term "comprise" and other forms thereof such as the third-person singular form "comprises" and the present participle form "comprising" are construed as open and inclusive meaning, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s) In addition, the specific features, structures, materials or characteristics may be included in any one or more embodiments or examples in any suitable manner.

In the following description, terms such as "first" and "second" are only used for descriptive purposes, and are not to be construed as indicating or implying the relative importance or implicitly indicating the number of indicated technical features. Thus, features defined by the terms "first" and "second" may explicitly or implicitly include one or more of the features. In the description of the embodiments of the present disclosure, the terms "a plurality of", "the plurality of", and "multiple" mean two or more unless otherwise specified.

The expression "at least one of A, B, and C" includes the following combinations of A, B, and C: only A, only B, only C, a combination of A and B, a combination of A and C, a combination of B and C, and a combination of A. B, and C. The expression "A and/or B" includes the following combinations: only A, only B, and a combination of A and B.

In the description of some embodiments, the expressions such as "coupled" and "connected" and their derivatives may be used. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled" or "communicatively coupled", however, may also mean that two or more elements are not in direct contact with each other, but yet still cooperate or interact with each other. The embodiments disclosed herein are not necessarily limited in this context.

In the related art, a chip and other structures are usually provided in a display panel in a manner of chip on glass (COG), chip on flex or chip on film (COF), or chip on PI or chip on panel (COP).

For the convenience of description, of two opposite surfaces of a base of the display panel, a surface away from the chip and other structures is referred to as a back surface in the following description.

In the manners of COG and COF, the base of the display panel is usually a rigid substrate such as a glass substrate, and the chip and other structures are provided on the glass substrate A portion of a flexible printed circuit board (PCB) electrically connected to the chip is bent to the back surface of the glass substrate, to reduce a planar space occupied by the PCB (that is, a space where the display panel is located in a plane direction).

In the manner of COP, the base of the display panel is usually a film such as a polyimide (PI) film, and the chip and other structures are provided on the PI film. Due to a bendability of the PI film, a portion of the PI film provided with the chip and other structures is bent toward the back surface of the PI film, to reduce a planar space occupied by the PI film. However, in the above manners, there is a bending region after the PCB or the PI film is bent, and it is difficult to reduce a planar space occupied by the bending region.

For this reason, some embodiments of the present disclosure provide a display panel. The display has a display area AA and a non-display area BB (as shown in part (b) of FIG. 5). The display panel includes: a base; and a circuit layer, an insulating layer, and a conductive layer that are sequentially stacked on the base. Via(s) are provided in the insulating layer, and the conductive layer is electrically connected to the circuit layer through the via(s).

The insulating layer includes a barrier layer, a buffer layer, a first gate insulating layer, a second gate insulating layer and an interlayer dielectric layer that are sequentially stacked on the circuit layer.

The circuit layer is configured to be bonded to an external circuit structure (for example, a circuit board). The conductive layer is configured such that electrical signals are transmitted between the same and the circuit layer.

Herein, the external circuit structure refers to a structure provided outside the display panel.

In some examples, the circuit layer and the conductive layer are both located within the display area AA (hereinafter referred to as the AA area) of the display panel. That is, the via(s) electrically connecting the two are also located within the AA area.

In some other examples, the circuit layer and the conductive layer are both located outside the AA area of the display panel (i.e., the non-display area BB of the display panel). That is, the via(s) electrically connecting the two are also located outside the AA area.

In yet some other examples, at least one of the circuit layer and the conductive layer is located within the AA area of the display panel. According to specific positions of the circuit layer and the conductive layer, the via(s) electrically connecting the two are located within or outside the AA area (i.e., within the AA area or within the non-display area BB).

The specific area(s) where the circuit layer and the conductive layer are located are not limited in some embodiments of the present disclosure, and may be adjusted according to the structures of different display panels.

In the display panel provided in the embodiments of the present disclosure, the circuit layer is provided inside the display panel, and the circuit layer is electrically connected to the conductive layer through the via(s) in the insulating layer located on the circuit layer, that is, there is an overlapping region between respective orthographic projections of the circuit layer and the conductive layer on the base. Therefore, without the display panel being bent, the respective orthographic projections of the circuit layer and the conductive layer on the base may have an overlapping region. In this way, it may be possible to improve the utilization rate of space of the display panel in a thickness direction thereof. In the meantime, since there is no bending region in the display panel, it may be possible to achieve a purpose of further reducing a width of a frame of the display panel.

FIG. 1A shows a schematic top view of a structure of a display panel, according to some embodiments of the present disclosure. For convenience of illustration, only an AA area 10 and a circuit layer 12 located within the AA area 10 are shown in FIG. 1A.

Figure 1B:
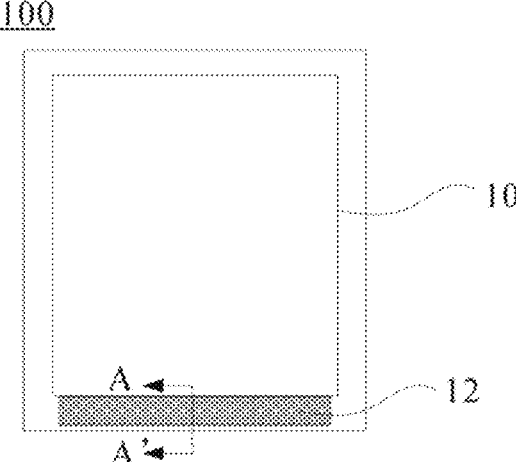
FIG. 1B shows a schematic top view of a structure of another display panel, according to embodiments of the present disclosure.

FIG. 1B shows a schematic top view of a structure of another display panel, according to some embodiments of the present disclosure. For convenience of illustration, only an AA area 10 and a circuit layer 12 located outside the AA area 10 are shown in FIG. 1B.

The display panel provided in the embodiments of the present disclosure will be specifically described below by taking the display panel 100 shown in FIG. 1A as an example.

Figure 2A:
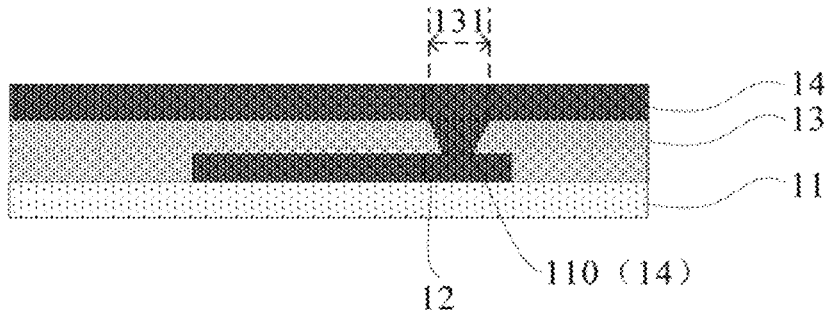
FIG. 2A shows a schematic cross-sectional diagram of a structure of the display panel taken along the A-A' direction in FIG. 1A or 1B, according to embodiments of the present disclosure.

FIG. 2A shows a schematic cross-sectional diagram of the display panel taken along the A-A' direction in FIG. 1A, according to some embodiments of the present disclosure. Referring to FIG. 2A, the display panel 100 includes a base 11, and the circuit layer 12, an insulating layer 13, and a conductive layer 14 sequentially stacked on the base 11.

Via(s) 131 are provided in the insulating layer 1 and the conductive layer 14 is electrically connected to the circuit layer 12 through the via(s) 131.

The insulating layer 13 is of a multilayer structure. As shown in FIGS. 2B to 2H, the insulating layer 13 includes a barrier layer 132, a buffer layer 133, a first insulating sub-layer 134, a second insulating sub-layer 135, and an interlayer dielectric layer 136 that are sequentially stacked on the circuit layer 12.

It will be understood that the circuit layer 12, the insulating layer 13, and the conductive layer 14 are sequentially stacked on the base 11, and the circuit layer 12 and the conductive layer 14 that are respectively located on two sides of the insulating layer 13 are electrically connected through the via(s) in the insulating layer between them. There is an overlapping region among respective orthographic projections of the circuit layer 12, the insulating layer 13, and the conductive layer 14 on the base 11.

It will be noted that, in some embodiments of the present disclosure, such settings as the number, the shapes and an arrangement of the via(s) 131 in the insulating layer 13 are not limited, and can be adjusted according to specific positions of the circuit layer 12 and the conductive layer 14 in the display panel.

In some examples, the number of the vias 131 in the insulating layer 13 is one. In some other examples, the number of the vias 131 in the insulating layer 13 is multiple. For convenience of illustration, only one via 131 is illustrated in FIGS. 2A to 2H as an example.

It will be understood that, since the insulating layer 13 is of the multilayer structure, each layer in the insulating layer 13 is provided with a same number of sub-vias (that is, one sub-via or multiple sub-vias). Each sub-via in each layer and a corresponding sub-via in an adjacent layer intercommunicate to form a via 131.

Figure 2B:
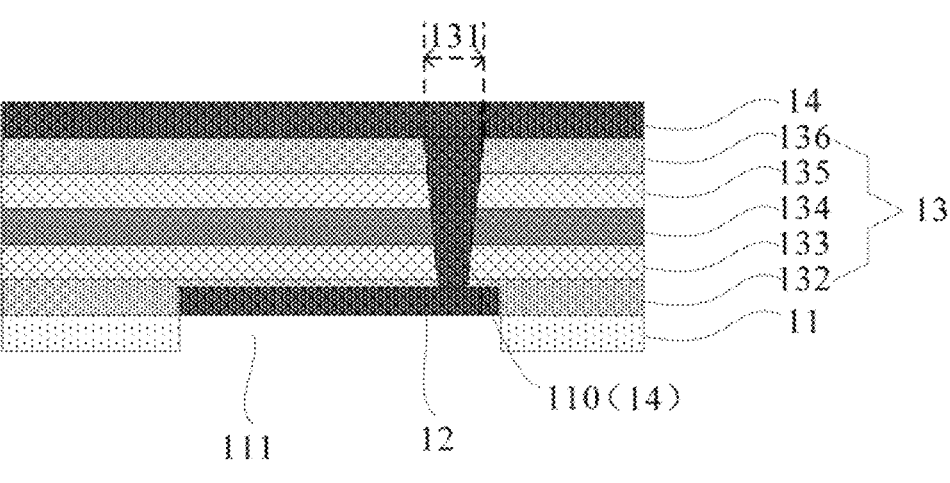
FIG. 2C shows a schematic cross-sectional diagram of another structure of the display panel taken along the A-A' direction in FIG. 1A or 1B, according to embodiments of the present disclosure.
FIG. 2D shows a schematic cross-sectional diagram of yet another structure of the display panel taken along the A-A' direction in FIG. 1A or 1B, according to embodiments of the present disclosure.
FIG. 2E shows a schematic cross-sectional diagram showing yet another structure of the display panel taken in the A-A' direction in FIG. 1A or 1B, according to embodiments of the present disclosure.
FIG. 2F shows a schematic cross-sectional diagram of yet another structure of the display panel taken along the A-A' direction in FIG. 1A or 1B, according to embodiments of the present disclosure.
FIG. 2G shows a schematic cross-sectional diagram of a structure of the display panel taken along the A-A' direction in FIG. 1A or 1B in a case where a conductive layer at an opening is bonded to an external circuit structure, according to embodiments of the present disclosure.
FIG. 2H shows a schematic cross-sectional diagram of another structure of the display panel taken along the A-A' direction in FIG. 1A or 1B in a case where a conductive layer at an opening is bonded to an external circuit structure, according to embodiments of the present disclosure.
Figure 2C:
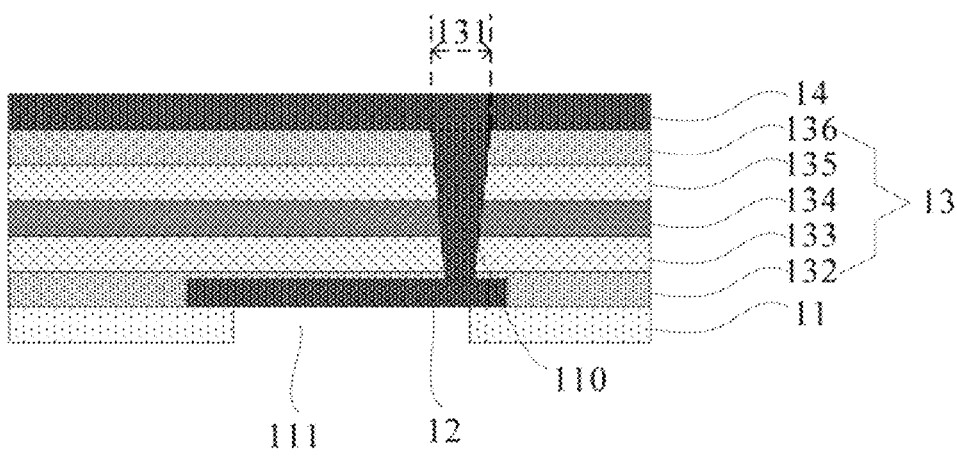

In some embodiments of the present disclosure, as shown in FIGS. 2B and 2C, the display panel 100 further includes a conductive material 110 provided in the via 131. The conductive material 110 is in contact with both the conductive layer 14 and the circuit layer 12, so that the conductive layer 14 can be electrically connected to the circuit layer 12 through the conductive material 110.

The embodiments of the present disclosure do not limit an arrangement of the conductive material 110 in the via 131, as long as it is ensured that the conductive material 110 in the via 131 is in contact with both the conductive layer 14 and the circuit layer 12, so that the conductive layer 14 can be electrically connected to the circuit layer 12 through the conductive material 110.

For example, the conductive material 110 in the via 131 may include an elemental metal, such as any one of copper, aluminum, steel, tungsten, tin, or lead. Alternatively, the conductive material 110 in the via 131 may be an alloy of the elemental metals, such as a copper-aluminum alloy.

For example, an entire space in any via 131 may be filled with the conductive material 110. Alternatively, a partial space in any via 131 is filled with the conductive material 110. For example, an inner surface of the via 131 is covered with a layer of conductive material 110, and a thickness thereof can be set by those skilled in the art according to a depth of the via 131, which is not limited in the embodiments of the present disclosure.

In some embodiments of the present disclosure, in a case where the depth of the via 131 is small, the conductive layer 14 may be electrically connected to the circuit layer 12 in a direct manner.

Figure 2D:
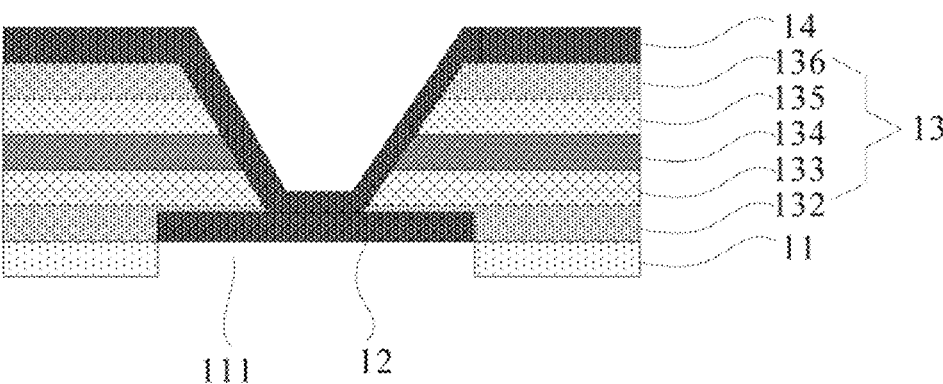
Figure 2E:
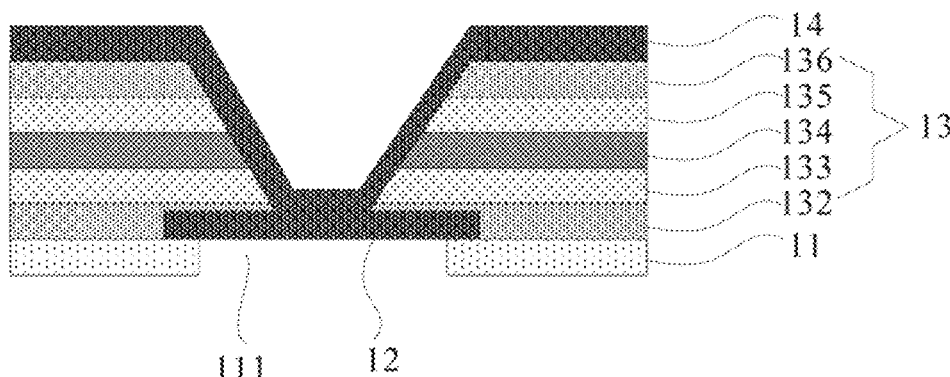

For example, as shown in FIGS. 2D and 2E, since the depth of the via 13 small, there is no need to fill the conductive material in the via 131. A portion of the conductive layer 14 may directly extend into the via 131, and contact a partial surface of the circuit layer 12 proximate to the insulating layer 13. The conductive layer 14 and the circuit layer 12 are electrically connected through surfaces that are in contact with each other.

In some examples, the conductive layer 14 is a conductive structure located in the AA area of the display panel, and the conductive layer 14 includes a plurality of electrodes. The plurality of electrodes are electrically connected to the circuit layer 12, so as to receive signals output from the circuit layer 12 or transmit signals to the circuit layer 12.

In some other examples, the conductive layer 14 is a conductive structure that is located outside the AA area of the display panel and used to transmit signals for structure(s) in the AA area. For example, the conductive layer 14 includes at least one of traces, leads of the traces, and a gate driver circuit.

Materials) of the conductive layer 14 may include at least one of titanium, aluminum, magnesium, silver, and tungsten. For example, if the conductive layer 14 includes three sub-layers that are stacked, it may be arranged that a material of an intermediate sub-layer is aluminum, and a material of the other two sub-layers is titanium. That is, in a stacking order, materials of the three sub-layers in the conductive layer 14 are titanium, aluminum, and titanium in order.

The circuit layer 12 may be a chip. Material(s) of the circuit layer 12 may include at least one of titanium, aluminum, magnesium, silver, and tungsten.

In some embodiments of the present disclosure, the material(s) of the circuit layer 12 may be same as the material(s) of the conductive layer 14. For example, in a case where the materials of the conductive layer 14 are titanium and aluminum, the materials of the circuit layer 12 may also be titanium and aluminum.

Of course, it will be understood that the materials of the circuit layer 12 and the conductive layer 14 may also be selected by those skilled in the art according to specific structures of the circuit layer 12 and the conductive layer 14, and are not limited in the embodiments of the present disclosure.

In some embodiments of the present disclosure, the base 11 may be a flexible base, for example, may be at least one of a PI film, a polyethylene terephthalate (PET) film, a polycarbonate (PC) film, a polymethyl methacrylate (PMMA) film, or a polyethersulfone resin (PES) film.

In some embodiments of the present disclosure the base 1 may be a rigid base such as a glass substrate.

In some embodiments of the present disclosure, referring to FIGS. 2B to 2H, opening(s) 111 corresponding to at least partial region of the circuit layer 12 are provided in the base 11.

For example, referring to FIGS. 2B and 2D, the opening 111 of the base 11 may correspond to an entire region of the circuit layer 12. That is, the opening 111 in the base 11 may cause a surface of the circuit layer 12 proximate to the base 11 to be entirely exposed.

Figure 2F:
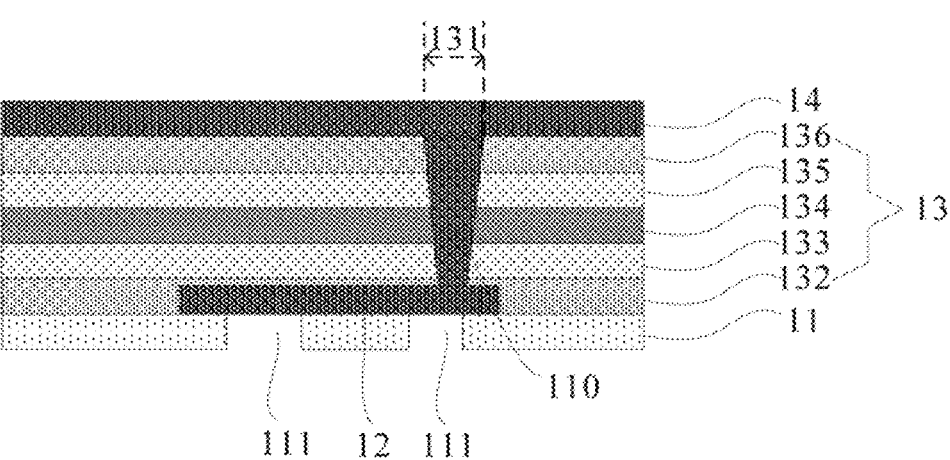

For example, referring to FIGS. 2C, 2E, and 2F, the opening(s) 111 of the base 11 may correspond to a partial region of the circuit layer 12. That is, the opening(s) 111 of the base 11 may cause a partial region of the surface of the circuit layer 12 proximate to the base 11 to be exposed.

Herein, a size and a shape of the partial region may be set by those skilled in the art according to a specific structure of the circuit layer 12, and are not limited in the embodiments of the present disclosure.

In the display panel shown in FIGS. 2B to 2E, only one opening is exemplarily provided in the base 11. It will be understood that, the number of the openings 111 in the base 11 may be one or multiple.

For example, if the number of the openings 111 in the base 11 is multiple, referring to FIG. 2F, two openings 111 are provided in the base 11 and the two openings 111 correspond to different regions of the circuit layer 12. An arrangement of the openings 111 can be adjusted according to a position of the circuit layer 12, an arrangement of the circuit layer 12, and other factors.

The opening 111 is configured to receive at least part of a circuit structure, so as to connect the external circuit structure into the display panel.

For example, the circuit structure includes, for example, at least one of a circuit board (for example, a flexible printed circuit (FPC)) and an integrated circuit (for example, IC).

The at least part of the circuit structure is provided in a region corresponding to the opening(s) 111, and is bonded (i.e., electrically connected) to the circuit layer 12.

It can be seen from this that, by providing the opening(s) 111 corresponding to the at least partial region of the circuit layer 12 in the base 11, circuit structures such as the flexible printed circuit and the IC may be provided on the at least partial region of the circuit layer 12 exposed by the opening(s) 111, thereby achieving a purpose of electrically connecting the circuit structure, the circuit layer 12 and the conductive layer 14.

Figure 2G:
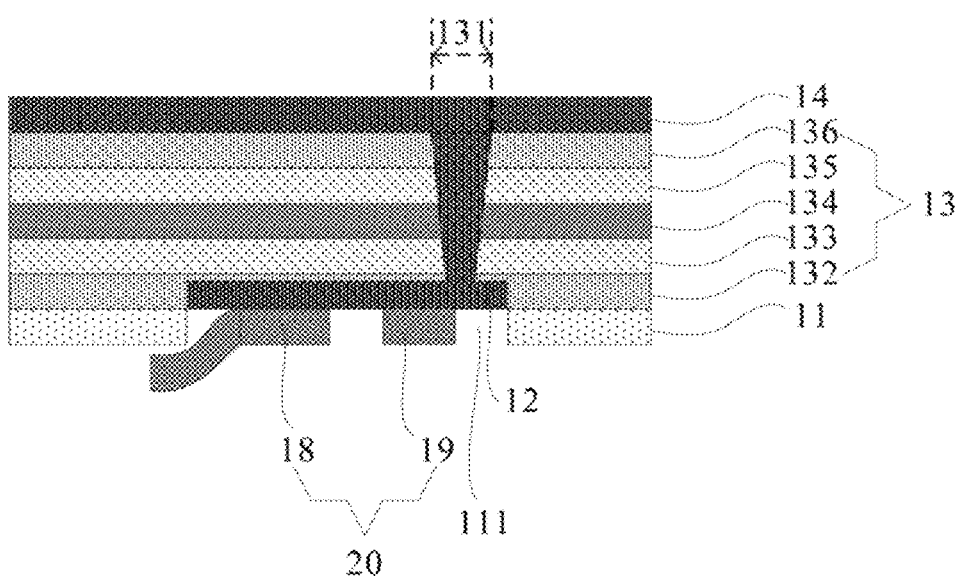

For example, referring to FIG. 2G, the circuit structure 20 includes a circuit board 18 and an IC 19. In FIG. 2G, the circuit board 18 is partially provided in the region corresponding to the opening 111.

Based on an electrical connection between the circuit board 18 and the circuit layer 12, the circuit board 18 may further be electrically connected to other devices in the display panel. The IC 19 is entirely provided on a side of the circuit layer 12 away from the conductive layer 14, and is electrically connected to the circuit layer 12.

For example, the circuit board 18 is a FPC. The circuit board 18 and the IC 19 may be welded on a surface of the circuit layer 12.

FIG. 2G shows a schematic diagram of a structure in which the IC 19 and a portion of the circuit board 18 are provided in the opening 111 of the display panel 100. It will be understood that, it may also be arranged that only one of the circuit board 18 and a portion of the IC 19 is provided in the opening 111.

It will be understood that, the arrangement of the circuit board 18 and the IC 19 described above is applicable to any one of the display panels shown in FIGS. 2B to 2F.

In some embodiments of the present disclosure, the display panel further includes a planarization layer provided on the conductive layer and a plurality of light-emitting devices provided on the planarization layer.

Figure 2H:
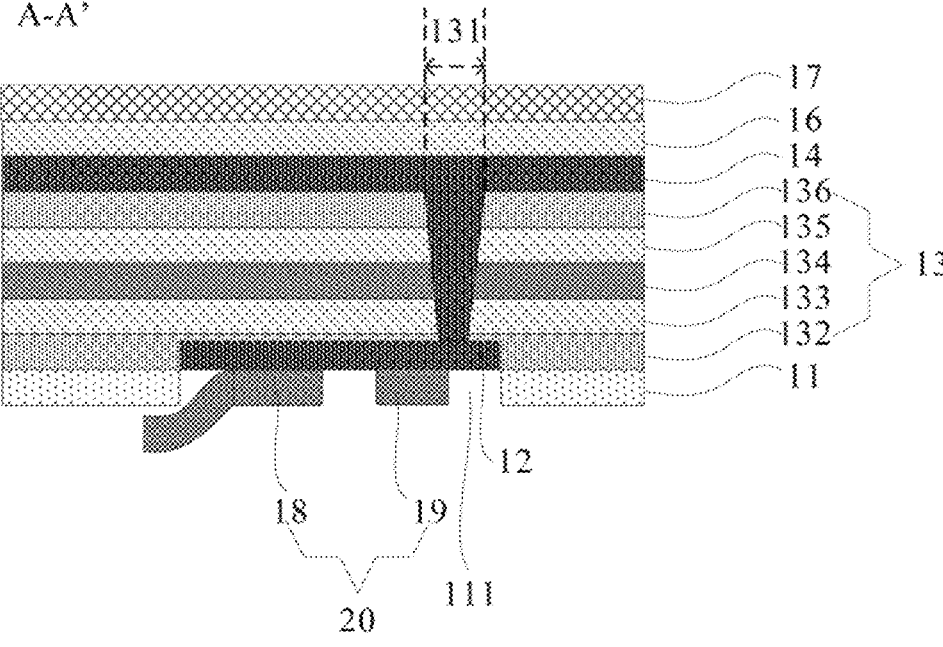

For example, referring to FIG. 2H, the display panel 100 provided in some embodiments of the present disclosure further includes a planarization layer 16 provided on the conductive layer 14, and a plurality of light-emitting devices 17 provided on the planarization layer 16. The light-emitting device 17 may include an OLED device.

It will be noted that, the plurality of light-emitting devices 17 are shown by a single layer in FIG. 2H, and each light-emitting device 17 is not specifically illustrated.

The embodiments of the present disclosure do not limit the number of the plurality of light-emitting devices 17, colors of light that the plurality of light-emitting devices 17 emit (for example, red, green, and blue), and an arrangement thereof, which can be designed according to specific display requirements of the display panel.

Moreover, it will be understood that the planarization layer 16 and an arrangement thereof, and the light-emitting devices 17 and an arrangement thereof are also applicable to any one of the display panels shown in FIGS. 2A to 2G.

It will be understood that the arrangement of the display panel shown in FIG. 1B in a direction perpendicular to the display panel is similar to the arrangement in FIG. 1A. As for details, reference may be made to corresponding description of the arrangement of the display panel in the direction perpendicular to the display panel in FIG. 1A, which will not be repeated herein.

In some examples, in a case where the circuit layer 12, the insulating layer 13, and the conductive layer 14 are all at least located in the AA area, the OLED devices are top-emitting devices. That is, light emitted by the OLED devices exits from a side away from the base 11, and will not pass through the base 11. Therefore, in the case where the circuit layer 12, the insulating layer 13, and the conductive layer 14 are all at least located in the AA area, the width of the frame of the display panel may be further reduced. In addition, since the OLED devices are the top-emitting devices, a normal display of the display panel will not be affected.

In some other examples, the display panel is a liquid crystal display (LCD) panel. Since the LCD panel displays images through light provided by a backlight module, in order to prevent the light from being shielded, the circuit layer 12, the conductive layer 14 and other structures are provided outside the AA area.

Figures 3, 4:
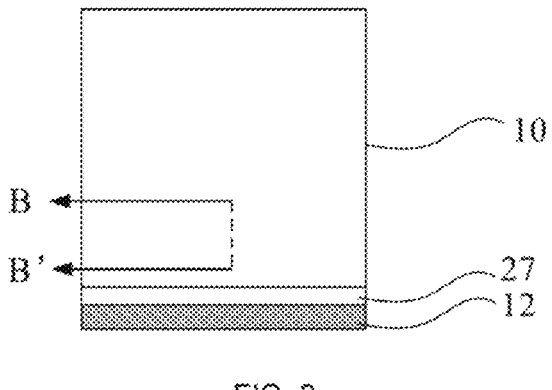
FIG. 3 shows a schematic top view a structure of a display panel in the related art.
FIG. 4 shows a schematic cross-sectional structural diagram taken along the B-B' direction in FIG. 3.

FIG. 3 is a schematic top view showing a structure of a display panel in the related art, and FIG. 4 is a schematic cross-sectional diagram showing a structure of the display panel in FIG. 3 taken along the B-B' direction.

As can be seen from FIG. 4, the conductive layer 14 is provided in the AA area 10 of the display panel, and the circuit layer 12 is not provided within a range of an orthographic projection of the conductive layer 14 on the base. As can be seen from FIG. 3, the circuit layer 12 is connected to the AA area 10 through a bending portion 27 (reference can be made to part (a) of FIG. 5 for the bending portion 27). The bending portion 27 is bent to the back surface of the display panel in a direction of the paper facing inward. However, since the bending portion forms a bending region, it is difficult to further reduce the width of the frame of the display panel.

In the display panel provided in the embodiments of the present disclosure, as can be seen from to FIGS. 1A to 2H, the circuit layer 12 is provided between the base 11 and the insulating layer 13, and the circuit layer 12 is electrically connected to the conductive layer 14 through the via 131 in the insulating layer 13. There is no need to bend the display panel in the embodiments of the present disclosure. Therefore, there is no bending region in the display panel, and the purpose of further reducing the width of the frame of the display panel may be achieved.

Figure 5:
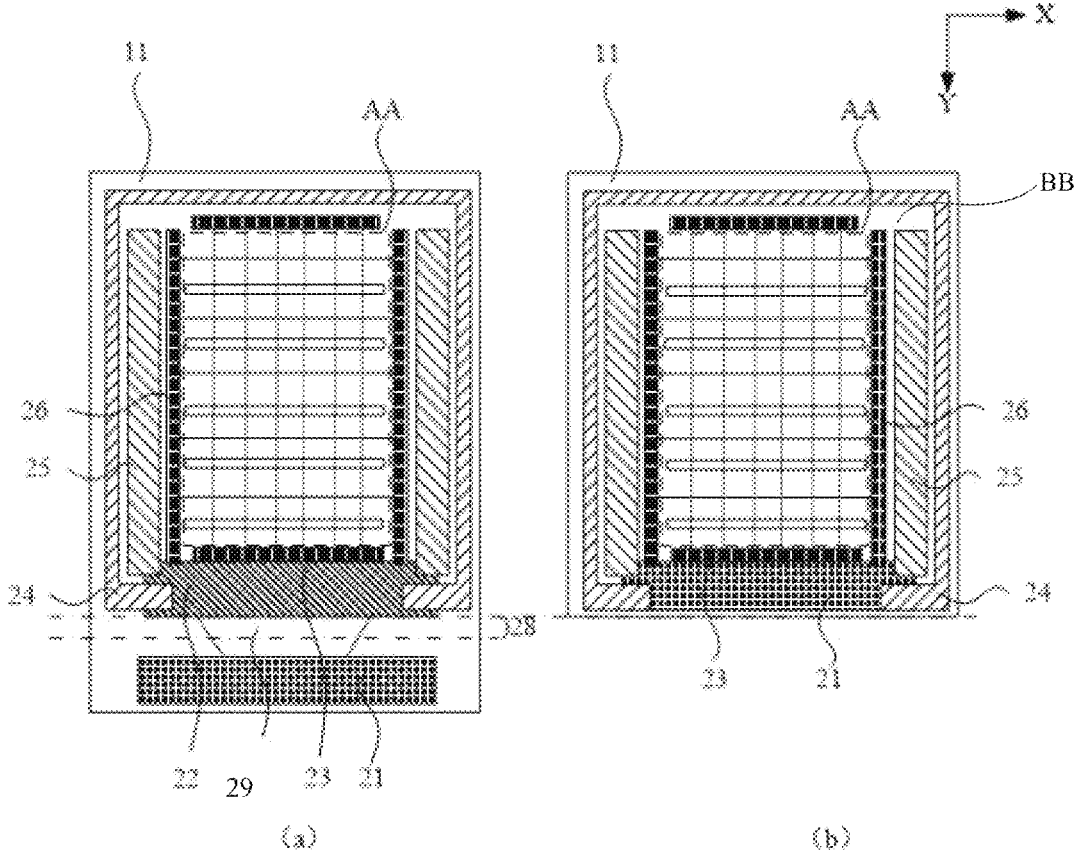
FIG. 5 shows a schematic diagram comparing a structure of a display panel in the related art and a structure of a display panel according to embodiments, of the present disclosure.

For example, part (a) of FIG. 5 shows a schematic top view of a structure of a display panel in the related art. Referring to part (a) of FIG. 5, the display panel includes a chip 21, wires 22, a power voltage line 23, a common voltage line 24, a gate driver circuit 25, and an initialization signal bus 26 that are provided on the base 11.

The base 11 is, for example, a flexible base. The power voltage line 23 may be, for example, a common voltage signal VSS line. The common voltage line 24 is, for example, a VDD line. A voltage transmitted on the VDD line is an operating voltage of devices in the display panel.

In the AA area, signal lines extending in an X direction are gate lines, and signal lines extending in a Y direction are data lines. Herein, FIG. 5 is only an illustration by taking an example in which the X direction is a row direction and the Y direction is a column direction. The data lines are electrically connected to the common voltage line 24. The power voltage line 23, the common voltage line 24, the gate driver circuit 25, and the initialization signal bus 26 are electrically connected to the wires 22, and are electrically connected to the chip 21 through the wires 22. The wires 22 and the chip 21 are electrically connected by a flexible PCB 29. That is, of two opposite sides of the flexible PCB 29, one side is electrically connected to the wires 22 and another side is electrically connected to the chip 21.

A portion of the base 11 provided with the chip 21, the flexible PCB 29 and other structures is bent toward the back surface of the base 11, so that the chip 21 is located on the back surface of the base 11.

Since after the portion of the base 11 provided with the chip 2 the flexible PCB 29 and other structures is bent, a bending region 28 will be formed (part (a) of FIG. 5 only exemplarily uses half of a width of the flexible PCB 29 as a width of the bending region 28), it is difficult to further reduce the width of the frame of the display panel.

Referring to part (b) of FIG. 5, in the display panel provided in some embodiments of the present disclosure, the chip 21 is provided on a back surface of a conductive layer (such as the wires). There are via(s) between the chip 21 and the wires, and the chip 21 is electrically connected to the wires through the via(s). Therefore, the display panel shown in part (b) of FIG. 5 does not have the bending portion 27 shown in part (a) of FIG. 5, and thus there is no bending region 28 formed by bending the bending portion 27.

By comparing parts (a) and (b) of FIG. 5, it can be known that the display panel shown in part (b) of FIG. 5 has a narrower bezel than the display panel shown in part (a) of FIG. 5 (the portion of the bezel been narrowed corresponds to the bending region 28 in part (a) of FIG. 5), and that the width of the bezel of the display panel is reduced.

Figure 6:
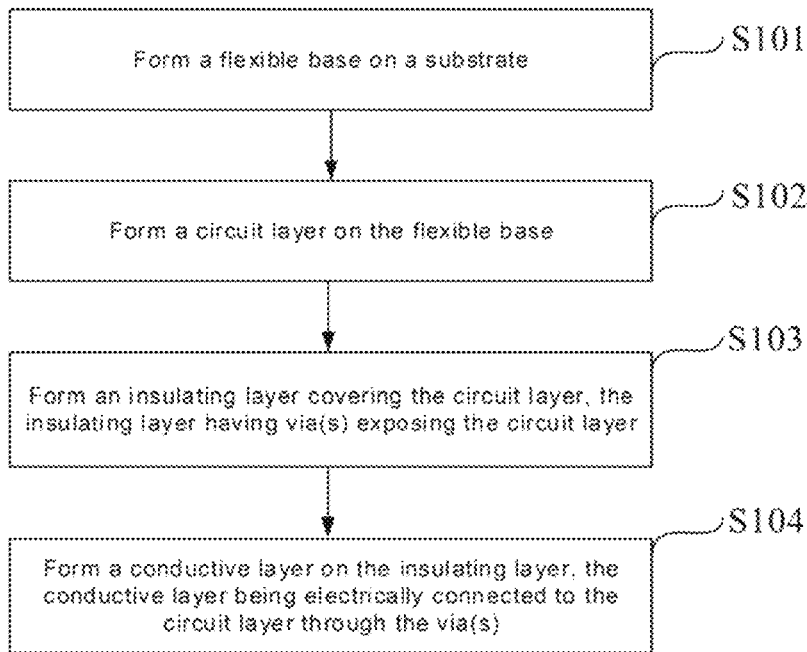
FIG. 6 shows a flowchart of a method for manufacturing a display panel, according to embodiments of the present disclosure.

Some embodiments of the present disclosure further provide a method for manufacturing a display panel. As shown in FIG. 6, the method includes the following steps: step 101 to step 103 (S101 to S103).

In S101, a flexible base is formed on a substrate.

Considering that a plurality of structures will be formed on the flexible base in a subsequent process, the flexible base is formed on the substrate first, so that the flexible base is supported. The flexible base may be, for example, a polyimide (PI) film, a polyethylene terephthalate (PET) film, a polycarbonate PC film, a polymethyl methacrylate (PMMA) film, or a polyethersulfone resin (PES) film.

For example, as shown in FIG. 8, S101 is performed. That is, a flexible base 11 is formed on a substrate 15.

In S102, a circuit layer is formed on the flexible base.

The circuit layer is configured to be bonded to an external circuit structure. The circuit layer may include a chip. The circuit layer has been described in the embodiments of the display panel. As for details, reference can be made to the corresponding description in the embodiments of the display panel, which will not be repeated herein.

For example, as shown in FIG. 9A, the base 11 is a flexible base. When S102 is performed, a circuit layer 12 is formed on the base 11.

It will be understood that, in some embodiments of the present disclosure, the flexible base may also be replaced with a rigid base. In a case where the flexible base is replaced with the rigid base, S101 is not performed, but S102 is directly performed. That is, the circuit layer is directly formed on the rigid base.

Figure 9B:
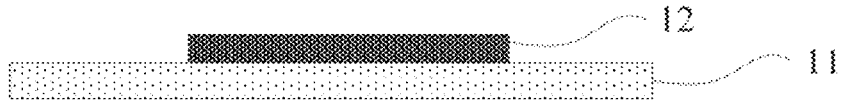
FIG. 9B shows a schematic diagram of another structure formed in step 102 of a method for manufacturing a display panel, according to embodiments of the present disclosure.

For example, as shown in FIG. 9B, the base 11 is a rigid base. The circuit layer 12 is directly formed on the base 11.

A method for forming the circuit layer on the flexible base can be selected by those skilled in the art according to the specific structure of the display panel, and is not limited in the embodiments of the present disclosure. Fat example, the circuit layer is formed on the base by using a sputtering process.

In S103, an insulating layer covering the circuit layer is formed. The insulating layer has via(s) exposing the circuit layer.

For example, the insulating layer is of a multilayer structure, and includes a barrier layer, a buffer layer, a first gate insulating layer, a second gate insulating layer and an interlayer dielectric layer that are sequentially stacked on the circuit layer.

During the formation of the insulating layer covering the circuit layer, each of multiple layers of films in an insulating film can be sequentially formed, and then a process such as etching is used to form the via(s) penetrating each of the multiple layers of films in the insulating film, so as to form the insulating layer.

Figure 10:
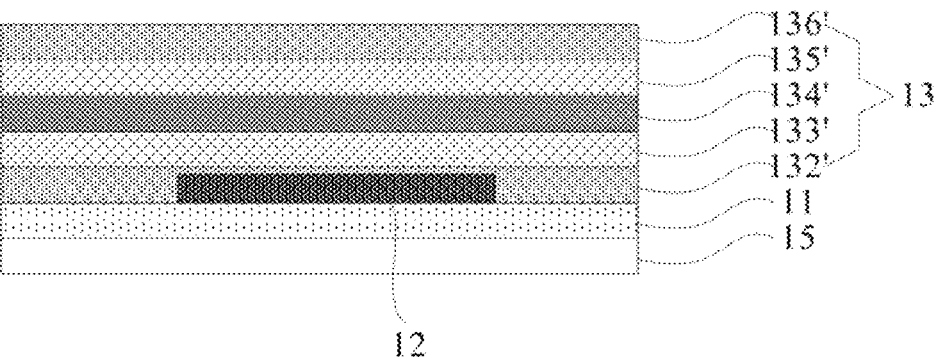
FIG. 10 shows a schematic diagram of a structure formed in step 103 of a method for manufacturing a display panel, according to embodiments of the present disclosure.
Figure 11:
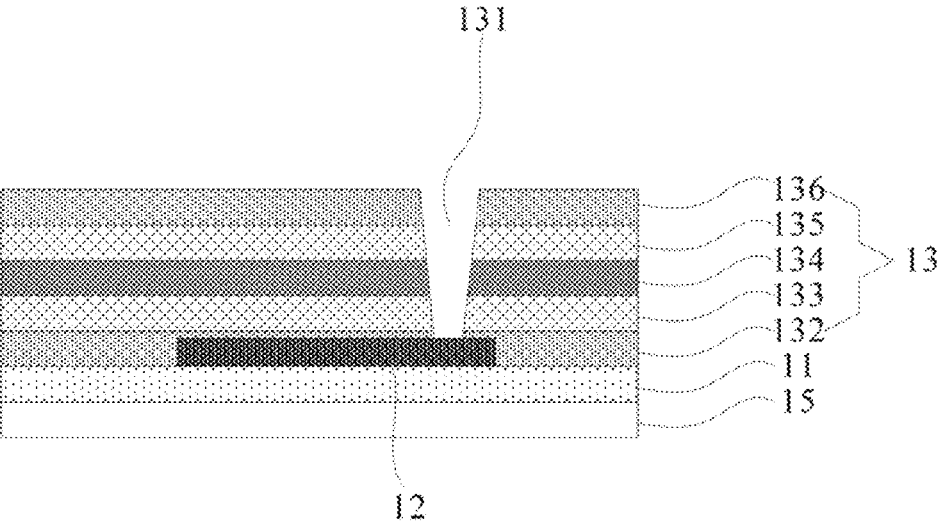
FIG. 11 shows a schematic diagram of another structure formed in step 103 of a method for manufacturing a display panel, according to embodiments of the present disclosure.

For example, in an example where the base is a flexible base, referring to FIGS. 10 and 11, when an insulating layer 13 is formed, a process such as deposition may be used to perform the following processes sequentially: a barrier film 132' corresponding to the barrier layer 132 is formed on a surface of the circuit layer 12 facing away from the base, a buffer film 133' corresponding to the buffer layer 133 is formed on a surface of the barrier film 132' facing away from the base, a first gate insulating film 134' corresponding to the first gate insulating layer 134 is formed on a surface of the buffer film 133' facing away from the base, a second gate insulating film 135' corresponding to the second gate insulating layer 135 is formed on a surface of the first gate insulating film 134' facing away from the base, and an interlayer dielectric film 136' corresponding to the interlayer dielectric layer 136 is formed on a surface of the second gate insulating film 135' facing away from the base. Then processes such as etching may be used to form the via 131 penetrating the multiple layers of films in the insulating film 13', so as to obtain the insulating layer 13 as shown in FIG. 11.

It will be understood that a method for forming the insulating layer 13 may also be as follows: whenever a layer of film in the insulating film 13' is formed, a sub-via that penetrates the layer of film is formed in the layer of film by an etching process or other processes, so that sub-vias at a same position in the layers of films together constitute the via 131.

For example, referring to FIGS. 10 and 11, if the insulating layer 13 includes the barrier layer 132, the buffer layer 133, the first gate insulating layer 134, the second gate insulating layer 135, and the interlayer dielectric layer 136 that are sequentially stacked on the circuit layer 12, a barrier film 132' corresponding to the barrier layer 132 may be formed on a surface of the circuit layer 12 facing away from the base first by using a process such as a deposition process, and then sub-via(s) that penetrate the barrier film 132' is formed in the barrier film 132' using a process such as an etching process, so as to obtain the barrier layer 132; then in a same method as forming the barrier layer 132, the buffer layer 133, the first gate insulating layer 134, the second gate insulating layer 135 and the interlayer dielectric layer 136 are sequentially formed, so as to obtain the insulating layer 13 as shown in FIG. 11.

In S104, a conductive layer is formed on the insulating layer, and the conductive layer is electrically connected to the circuit layer through the via(s).

The conductive layer is configured such that electrical signals are transmitted between the same and the circuit layer.

In some embodiments of the present disclosure, before S104 is performed, a conductive material may be filled in the via(s) first. The conductive material is in contact with the circuit layer.

Figure 12:
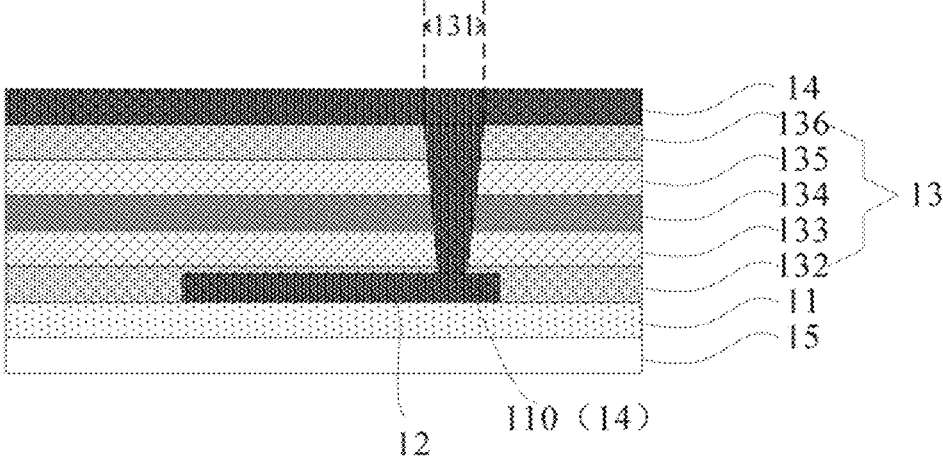
FIG. 12 shows a schematic diagram of another structure formed in step 104 of a method for manufacturing a display panel, according to embodiments of the present disclosure.

For example, referring to FIG. 12, an entire space in the via 131 may be filled with a conductive material 110. Or, a partial space in the via 131 is filled with the conductive material 110. For example, an inner surface of the via 131 is covered with a layer of conductive material 110, and a thickness thereof can be set by those skilled in the art according to the depth of the via, which is not limited in the embodiments of the present disclosure. In a specific implementation manner, an arrangement of the conductive material in the via(s) is not limited in the embodiments of the present disclosure, as long as the conductive material 110 is in contact with the circuit layer 12.

In a process of forming the conductive layer 14 on the insulating layer 13, the conductive layer 14 is in contact with the conductive material 110, so that the conductive layer 14 may be electrically connected to the circuit layer 12 through the conductive material in the via 131. There is no need for the conductive layer 14 to extend into the via 131.

Figure 13:
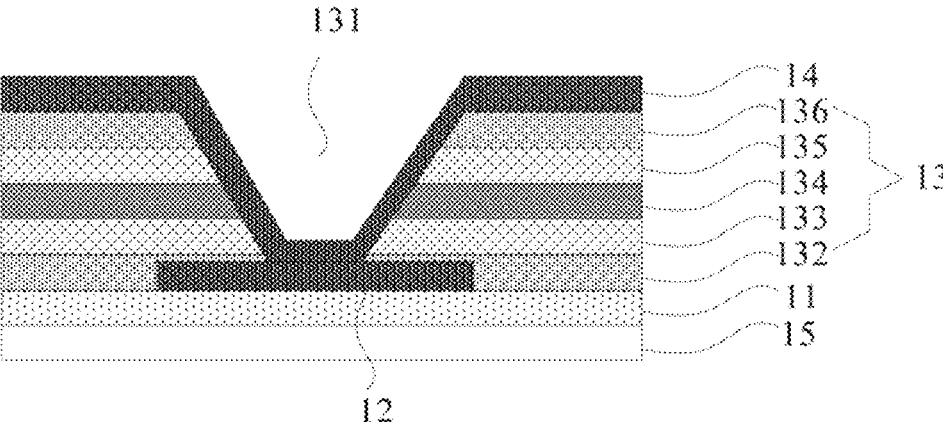
FIG. 13 shows schematic diagram of a specific structure formed in step 104 of a method for manufacturing a display panel, according to embodiments of the present disclosure.

In some other embodiments of the present disclosure, the conductive layer may be directly formed on the insulating layer. In an example where the base is a flexible base, referring to FIG. 12, the conductive material 110 is not filled in the via 131. A portion of the conductive layer 14 extends into the via 131, and contacts a partial surface of the circuit layer 12 proximate to the insulating layer 13. For example, as shown in FIG. 13, a portion of the conductive layer 14 extends into the via 131, and contacts the partial surface of the circuit layer 12 proximate to the insulating layer 13.

The embodiments of the present disclosure do not limit a forming process of the conductive layer 14. For example, the conductive layer 14 may be formed by using a sputtering process, a chemical vapor deposition (CVD) process, or the like. Due to a good film formation effect of the CVD process, the CVD process is usually adopted.

In some embodiments of the present disclosure, after S104 is performed, referring to FIG. 7, step 105 to step 106 (S105 to S106) may be further performed in embodiments of the present disclosure.

In S105, a planarization layer is formed on the conductive layer, and light-emitting devices are formed on the planarization layer.

Figure 14:
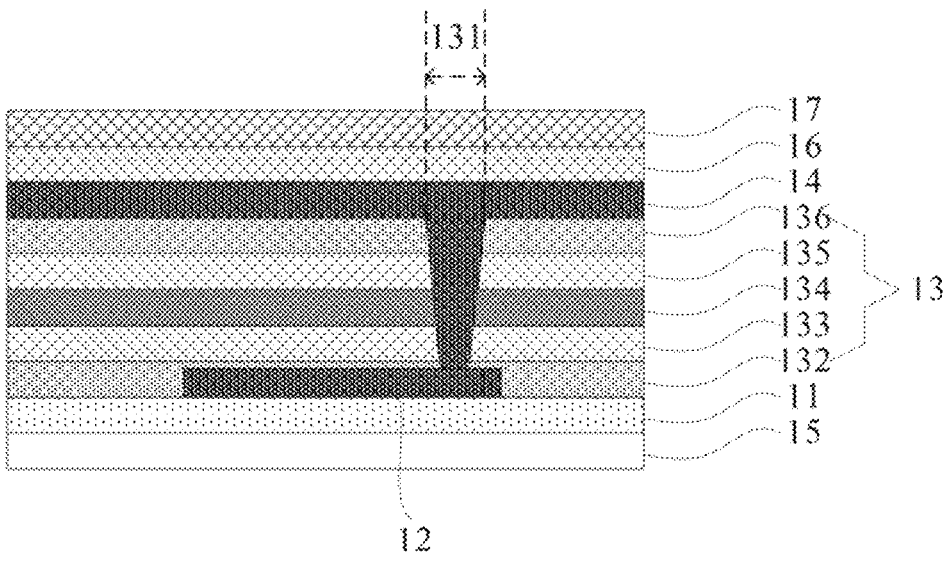
FIG. 14 shows a schematic diagram of a structure formed in step 105 of a method for manufacturing a display panel, according to embodiments of the present disclosure.

For example, in the example where the base is the flexible base, referring to FIG. 14, after S104 is performed, a planarization layer 16 may be formed on the conductive layer 14 first, and then a plurality of light-emitting devices 17 are formed on the planarization layer 16. As for the light-emitting devices 17, reference can be made to the corresponding description in the embodiments of the display panel, which will not be repeated herein.

In S106, opening(s) are formed in the flexible base. The opening(s) expose at least partial region of the circuit layer.

In some embodiments of the present disclosure, the base is a flexible base. The substrate and a portion of the flexible base corresponding to the at least partial region of the circuit layer may be taken as a one-piece structure, and the one-piece structure may be separated from other portion of the flexible base, so as to form the opening(s) exposing the at least partial region of the circuit layer.

When this step is performed, a laser lift-off technology may be used to achieve the separation process. For example, a laser beam may be used to scan other regions of the substrate other than a region corresponding to the at least partial region of the circuit layer. The substrate may be penetrated by a penetrating laser beam to irradiate the other portions of the flexible base (usually a flexible film made of an organic material), so that photon energy of the laser beam can act on the other portions of the flexible base. As a result, a surface of the other portions of the flexible base that is in contact with the substrate will absorb the photon energy, so that a thin layer of the other portions of the flexible base will undergo a chemical reaction, and will then be converted into a liquid or gaseous substance and separated from the portion of the flexible base. Finally, the flexible base in the laser scanning region is separated at a surface thereof that is in contact with the substrate.

Figure 15:
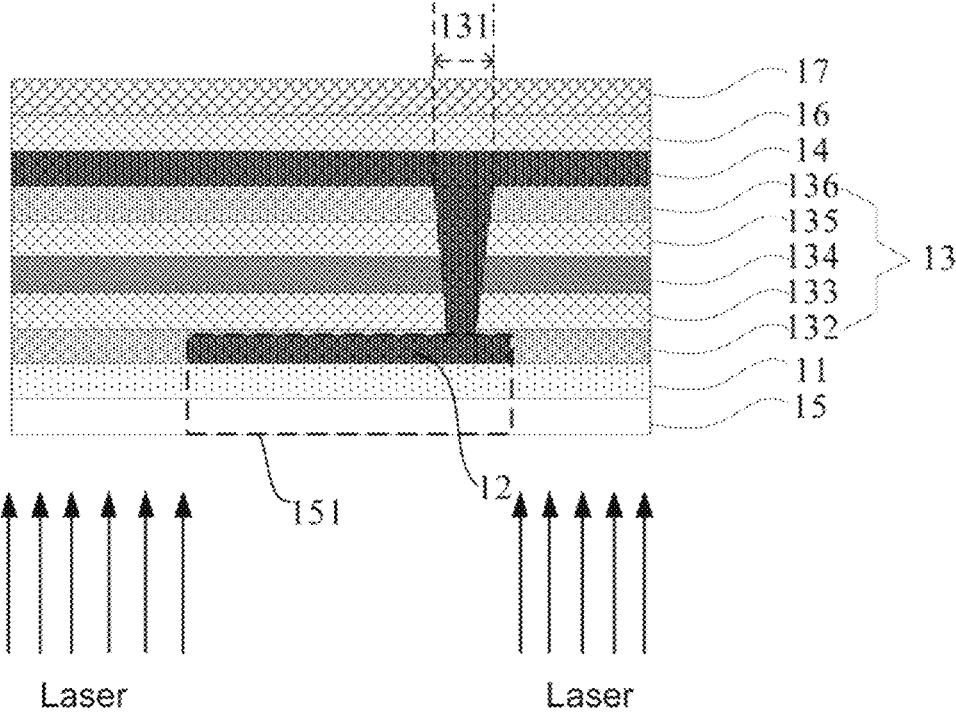
FIG. 15 shows a schematic diagram of a laser scanning region in step 106 of a method for manufacturing a display panel, according to embodiments of the present disclosure.

For example, referring to FIG. 15, laser scanning is performed on other regions of the substrate 15 other than a region 151 corresponding to the circuit layer 12. That is, scanning is performed on regions of the substrate 15 other than a portion that is illustrated by a dotted box in FIG. 15.

After laser scanning is performed on other regions of the substrate other than the region corresponding to the at least partial region of the circuit layer, since the base in the laser scanning region is separated at the surface thereof that is in contact with the substrate, in this step, the substrate and the portion of the flexible base corresponding to the at least partial region of the circuit layer are taken as a one-piece structure, and the one-piece structure is separated from the other portions of the flexible base.

For example, referring to FIG. 16, the substrate 15 and a portion of the flexible base 11 corresponding to the circuit layer 12 are taken as a one-piece structure, and the one-piece structure is separated from a portion of the flexible base 11 other than a portion corresponding to the circuit layer 12.

That is, the substrate 15 and the portion of the flexible base 11 corresponding to the circuit layer 12 are regarded as a first portion, and a portion of the structure formed in S105 other than the first portion is regarded as a second portion; and the first portion is separated from the second portion. Since laser scanning is not performed on the portion of the flexible base 11 corresponding to the circuit layer 12, the portion of the flexible base 11 corresponding to the circuit layer 12 is left on the substrate 15 during the separating process. Correspondingly, an opening 111 is formed in the second portion of the flexible base 11, and the opening 111 exposes the at least partial region of the circuit layer 12.

In some other embodiments of the present disclosure, the flexible base may be replaced with a rigid base. In a case where the flexible base is replaced with a rigid base, the opening(s) may be formed in the rigid base directly by a process, such as an etching process, or a cutting process.

In yet another embodiment of the present disclosure, a display apparatus is provided. Referring to FIG. 17, the display apparatus 200 includes any one of the display panels 100 provided in the embodiments of the present disclosure.

In some embodiments of the present disclosure, referring to FIG. 18, the display apparatus 200 further includes a circuit structure 20 located outside the display panel 100.

Opening(s) corresponding to the at least partial region of the circuit layer in the display panel 100 is provided in the flexible base of the display panel 100. At least part of the circuit structure is provided in the opening(s).

As for an arrangement of the opening(s), reference can be made to the corresponding description in the embodiments of the display panel 100, which will not be repeated herein.

In some embodiments of the present disclosure the circuit structure includes a circuit board (e.g., an FPC).

Figure 19A:
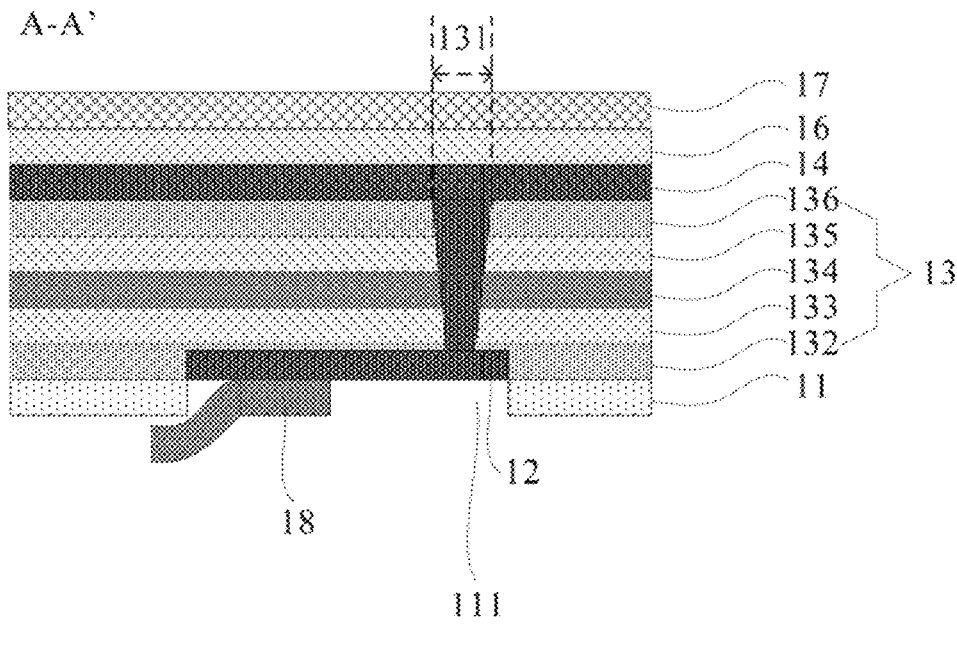
FIG. 19A shows a schematic cross-sectional diagram of a structure of a display apparatus including the display panel in FIG. 1A or 1B taken along the A-A' direction in FIG. 1A or 1B, according to embodiments of the present disclosure.

For example, the display apparatus 200 includes the display panel 100. FIG. 19A shows a schematic cross-sectional diagram of the display apparatus 200 taken along the A-A' direction in the display panel 100 shown in FIG. 1A.

Referring to FIG. 19A, a circuit structure is provided on the circuit layer that is exposed by the opening. For example, the circuit structure may be welded on a surface of the circuit layer proximate to the base and located in the opening. The circuit structure includes a circuit board 18.

In some embodiments of the present disclosure, the circuit structure further includes other integrated circuits (for example, an integrated circuit (IC)) for transmitting corresponding signals.

Figure 19B:
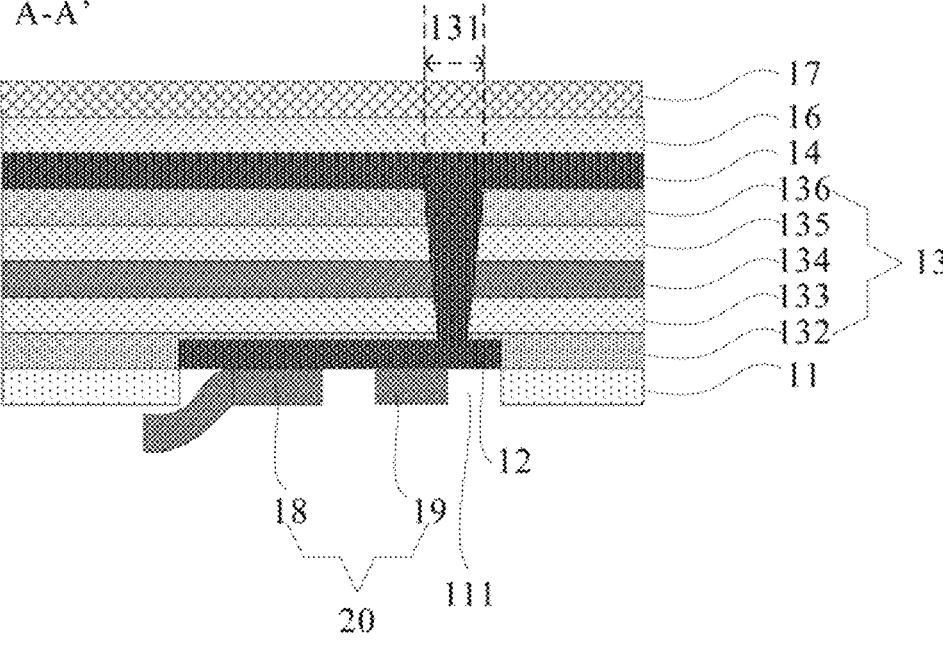
FIG. 19B shows a schematic cross-sectional diagram of another structure of a display apparatus including the display panel in FIG. 1A or 1B taken along the A-A' direction in FIG. 1A or 1B, according to embodiments of the present disclosure.

For example, the display apparatus 200 includes the display panel 100 FIG. 19B shows a schematic cross-sectional diagram of the display apparatus 200 taken along the A-A' direction in the display panel 100 shown in FIG. 1A. Referring to FIG. 19B, the circuit structure 20 includes a circuit board 18 and an IC 19.

As shown in FIGS. 19A and 19B, the circuit board 18 is partially provided in the opening 111.

A portion of the circuit board 18 is electrically connected to the circuit layer 12. Another portion of the circuit board 18 is not electrically connected to the circuit layer 12, so as to electrically connect other devices in the display apparatus. For example, the circuit board 18 may be a FPC. The circuit board 18 may be welded on a surface of the circuit layer 12.

For example, as shown in FIG. 19B, the IC 19 is entirely provided on a side of the circuit layer 12 away from the conductive layer 14, and is electrically connected to the circuit layer 12. The IC 19 may be welded on a surface of the circuit layer 12.

FIG. 19B shows a case where both the circuit board 18 and the IC 19 are provided in the opening 111. It will be understood that, it may also be arranged that only one of the circuit board 18 and the IC 19 is provided in the opening 111.

It will be understood that the arrangement of the circuit board 18 and the IC 19 described above may be applicable to any one of the display panels shown in FIGS. 2B to 2F in the embodiments of the display panel.

There may be various ways to connect the circuit structure to the display panel. For example, the circuit layer 12 includes a patterned metal layer, which is provided on a surface of the circuit layer 12 proximate to the base 11. The pattern includes, for example, at least one of several circuit board patterns and several IC patterns. Based on the pattern(s), a circuit structure corresponding to each pattern may be provided on the surface of the circuit layer 12 proximate to the base 11. For example, the circuit structure corresponding to each pattern is welded at a position corresponding to the pattern.

In summary, in the display panel provided in the embodiments of the present disclosure, the circuit layer is directly formed at the back surface of the display panel, and is electrically connected to the conductive layer by forming via(s). Therefore, there is no bending region in the display panel, and there is no need to provide a frame corresponding to the bending region in the display panel. As a result, the purpose of reducing the width of the frame of the display panel may be achieved. In addition, in the embodiments of the present disclosure, opening(s) may further be formed in the base at a position corresponding to the at least partial region of the circuit layer. Therefore, the circuit structure such as the circuit board and the IC may be electrically connected to the circuit layer exposed by the opening(s) through the opening(s), so as to achieve the purpose of incorporating the circuit structure into the display apparatus.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display apparatus, comprising:
a display panel having a display area and a non-display area; and
a circuit structure located outside the display panel;
wherein the display panel comprises:
a flexible base; and
a circuit layer, an insulating layer, and a conductive layer that are sequentially stacked on the flexible base, wherein:
the circuit layer is provided between the flexible base and the insulating layer, and the circuit layer and the conductive layer are both located within the display area;
orthographic projections of the circuit layer, the insulating layer, and the conductive layer on the flexible base have an overlapping region within the display area;
the circuit layer is configured to be bonded to the circuit structure, and the conductive layer is configured such that electrical signals are transmitted between the conductive layer and the circuit layer;
at least one via is disposed in the insulating layer, an orthogonal projection of the at least one via on the flexible base is located within the overlapping region, and the conductive layer is electrically connected to the circuit layer through the at least one via;
at least one opening corresponding to at least one partial region of the circuit layer is provided in the flexible base, the at least one opening is configured to receive a part of the circuit structure, and the part of the circuit structure is disposed in the at least one opening;

the conductive layer includes three sub-layers that are stacked, a material of an intermediate sub-layer among the three sub-layers includes aluminum, and a material of other two sub-layers is titanium;

the circuit layer includes a chip; and the conductive layer includes a portion directly extending into the at least one via, covering a side wall of the at least one via and contacting a partial surface of the circuit layer proximate to the insulating layer, wherein the portion of the conductive layer is recessed towards the circuit layer to form an inverted trapezoidal recess; the conductive layer and the circuit layer are electrically connected through surfaces that are in contact with each other.

2. The display apparatus according to claim 1, wherein the conductive layer includes at least one of traces, leads of the traces, electrodes, and a gate driver circuit.

3. The display apparatus according to claim 1, wherein the display panel further comprises a planarization layer disposed on the conductive layer and a plurality of light-emitting devices disposed on the planarization layer.

4. The display apparatus according to claim 3, wherein the insulating layer is at least located in the display area; and the plurality of light-emitting devices are top-emitting devices.

5. The display apparatus according to claim 4, wherein the least one opening includes a plurality of openings.

6. The display apparatus according to claim 1, wherein the circuit structure includes a circuit board.

7. The display apparatus according to claim 1, wherein the insulating layer includes a barrier layer, a buffer layer, a first gate insulating layer, a second gate insulating layer and an interlayer dielectric layer that are sequentially stacked on the circuit layer.

8. A method for manufacturing a display apparatus, the method comprising:

forming a display panel; and forming a circuit structure located outside the display panel;

wherein forming the display panel, comprises:

forming a flexible base on a substrate;

forming a circuit layer on the flexible base, wherein the circuit layer is configured to be bonded to the circuit structure;

forming an insulating layer covering the circuit layer, wherein the insulating layer includes a barrier layer, a buffer layer, a first gate insulating layer, a second gate insulating layer, and an interlayer dielectric layer that are sequentially stacked on the circuit layer, and the insulating layer has at least one via exposing the circuit layer;

forming a conductive layer on the insulating layer, wherein the conductive layer is electrically connected to the circuit layer through the at least one via, the conductive layer includes three sub-layers that are stacked, a material of an intermediate sub-layer among the three sub-layers includes aluminum, a material of other two sub-layers is titanium, the conductive layer is configured such that electrical signals are transmitted between the conductive layer and the circuit layer, the display panel has a display area and a non-display area, the circuit layer is provided between the flexible base and the insulating layer, the circuit layer and the conductive layer are both located within the display area, orthographic projections of the circuit layer, the insulating layer, and the conductive layer on the flexible base have an overlapping region, and an orthogonal projection of the at least one via on the flexible base is located within the overlapping region within the display area, and the circuit layer includes a chip; and after forming the circuit layer on the flexible base, forming the display panel further comprises:

forming at least one opening in the flexible base, the at least one opening exposing at least one partial region of the circuit layer, the at least one opening receiving a part of the circuit structure, and the part of the circuit structure being disposed in the at least one opening;

wherein the conductive layer includes a portion directly extending into the at least one via, covering a side wall of the at least one via and contacting a partial surface of the circuit layer proximate to the insulating layer, wherein the portion of the conductive layer is recessed towards the circuit layer to form an inverted trapezoidal recess; the conductive layer and the circuit layer are electrically connected through surfaces that are in contact with each other.

9. The method for manufacturing the display apparatus according to claim 8, wherein forming the at least one opening in the flexible base, the at least one opening exposing the at least one partial region of the circuit layer, includes:

separating a one-piece structure as which the substrate and a portion of the flexible base corresponding to the at least one partial region of the circuit layer are taken from a portion of the flexible base other than the portion corresponding to the at least one partial region, so as to form the at least one opening exposing the at least one partial region of the circuit layer.

10. The method for manufacturing the display apparatus according to claim 9, wherein separating the one-piece structure as which the substrate and the portion of the flexible base corresponding to the at least one partial region of the circuit layer are taken from the portion of the flexible base other than the portion corresponding to the at least one partial region, so as to form the at least one opening exposing the at least one partial region of the circuit layer, includes:

performing laser scanning on other regions of the substrate other than a region corresponding to the at least one partial region of the circuit layer; and separating the one-piece structure as which the substrate and the portion of the flexible base corresponding to the at least one partial region of the circuit layer are taken from the portion of the flexible base other than the portion corresponding to the at least one partial region.

* * * * *